(12) United States Patent
Carducci et al.

(10) Patent No.: US 11,814,724 B2
(45) Date of Patent: Nov. 14, 2023

(54) CONTINUOUS LINER FOR USE IN A PROCESSING CHAMBER

(71) Applicant: APPLIED MATERIALS, INC., Santa Clara, CA (US)

(72) Inventors: James D. Carducci, Sunnyvale, CA (US); Kenneth S. Collins, San Jose, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/051,321

(22) Filed: Oct. 31, 2022

(65) Prior Publication Data

US 2023/0175123 A1 Jun. 8, 2023

Related U.S. Application Data

(62) Division of application No. 17/117,514, filed on Dec. 10, 2020, now Pat. No. 11,499,223.

(51) Int. Cl.
*C23C 16/44* (2006.01)
*C23C 16/455* (2006.01)
*C23C 16/458* (2006.01)

(52) U.S. Cl.
CPC ...... *C23C 16/4401* (2013.01); *C23C 16/4412* (2013.01); *C23C 16/4585* (2013.01); *C23C 16/4586* (2013.01); *C23C 16/45565* (2013.01)

(58) Field of Classification Search
CPC ............ C23C 16/4401; C23C 16/4412; C23C 16/45565; C23C 16/4585; C23C 16/4586
USPC .......... 118/723 E, 723 ER, 715; 156/345.43, 156/345.44, 345.45, 345.46, 345.47; 427/248.1, 569, 570, 533, 535, 96.8, 237, 427/255.23, 255.28; 216/58, 67
See application file for complete search history.

(56) References Cited

U.S. PATENT DOCUMENTS

| | | |
|---|---|---|
| 6,403,491 B1 | 6/2002 | Liu et al. |
| 6,465,051 B1 | 10/2002 | Sahin et al. |
| 6,716,302 B2 | 4/2004 | Carducci et al. |

(Continued)

FOREIGN PATENT DOCUMENTS

| | | |
|---|---|---|
| WO | 0237541 A2 | 5/2002 |
| WO | 2009097181 A2 | 8/2009 |
| WO | 2012128783 A1 | 9/2012 |

OTHER PUBLICATIONS

PCT International Search Report and Written Opinion for International Application No. PCT/US2021/062685 dated Apr. 6, 2022, 9 pages.

*Primary Examiner* — Rudy Zervigon
(74) *Attorney, Agent, or Firm* — Lowenstein Sandler LLP

(57) ABSTRACT

Certain embodiments of the present disclosure relate to chamber liners, processing chambers that include chamber liners, and methods of using the same. In one embodiment, a method of operating a processing chamber includes causing a chamber liner within the processing chamber to move to a loading position to allow a substrate to be inserted through an access port of the processing chamber into an interior volume of the processing chamber. The method further includes causing the chamber liner to move to an operation position that blocks the access port after the substrate has been inserted into the interior volume. The method further includes generating a plasma using a cathode assembly.

19 Claims, 8 Drawing Sheets

(56) References Cited

U.S. PATENT DOCUMENTS

| | | |
|---|---|---|
| 6,857,387 B1 * | 2/2005 | Sun .................... H01J 37/32165 |
| | | 156/345.43 |
| 7,011,039 B1 | 3/2006 | Mohn et al. |
| 8,597,462 B2 | 12/2013 | Brown et al. |
| 8,668,816 B2 | 3/2014 | Ding et al. |
| 8,840,725 B2 | 9/2014 | Palagashvili et al. |
| 9,741,546 B2 | 8/2017 | Carducci et al. |
| 9,953,825 B2 | 4/2018 | Carman et al. |
| 9,972,477 B2 | 5/2018 | Tan et al. |
| 10,047,430 B2 | 8/2018 | Ding et al. |
| 10,242,847 B2 | 3/2019 | Carducci et al. |
| 2002/0069970 A1 | 6/2002 | Noorbakhsh et al. |
| 2005/0005859 A1 | 1/2005 | Koshiishi et al. |
| 2005/0150452 A1 | 7/2005 | Sen et al. |
| 2005/0196971 A1 * | 9/2005 | Sen ..................... C23C 16/4585 |
| | | 438/778 |
| 2006/0105575 A1 * | 5/2006 | Bailey, III ........ H01L 21/67051 |
| | | 257/E21.311 |
| 2010/0129548 A1 | 5/2010 | Sneh |
| 2011/0061813 A1 * | 3/2011 | Iizuka ............... H01J 37/32091 |
| | | 156/345.34 |
| 2014/0053984 A1 | 2/2014 | Doh et al. |
| 2014/0345525 A1 | 11/2014 | Ranish et al. |
| 2015/0221481 A1 | 8/2015 | Willwerth et al. |
| 2017/0338134 A1 * | 11/2017 | Tan .................... H01J 37/32816 |
| 2018/0061618 A1 | 3/2018 | Nicholas et al. |
| 2018/0261453 A1 * | 9/2018 | Ghosh ............... H01L 21/02208 |
| 2019/0067006 A1 | 2/2019 | Hawrylchak et al. |
| 2020/0043706 A1 | 2/2020 | Li et al. |
| 2020/0066493 A1 | 2/2020 | Noorbakhsh et al. |
| 2020/0161171 A1 | 5/2020 | Colombeau et al. |
| 2021/0079524 A1 * | 3/2021 | Yang .................. C23C 16/4583 |

\* cited by examiner

CONTINUOUS LINER FOR USE IN A PROCESSING CHAMBER

RELATED APPLICATIONS

This application claims the benefit of U.S. non-Provisional application Ser. No. 17/117,514 filed on Dec. 10, 2020, the entire contents of which is hereby incorporated by reference.

TECHNICAL FIELD

Embodiments of the disclosure relate to processing chambers for semiconductor processing applications and, more specifically, to liner components within processing chambers.

BACKGROUND

Integrated circuits are made possible by processes which produce intricately patterned material layers on substrate surfaces. Etch processes, deposition processes, and cleaning processes may be performed in a variety of chambers. These chambers may include components that facilitate the formation of capacitively-coupled or inductively-coupled plasmas, for example. A key aspect of plasma reactor design is internal reactor symmetry, where the symmetry of the electrical field in the plasma reactor induced by RF-biased electrodes can have a significant impact on the reactor performance. Current systems, however, generally contain internal components that introduce asymmetries into the reaction volume, often resulting in non-uniform etch rates and other negative effects, such as wafer tunneling effects.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an exemplary embodiment, a method of operating a processing chamber includes causing a chamber liner within the processing chamber to move to a loading position to allow a substrate to be inserted through an access port of the processing chamber into an interior volume of the processing chamber. The method further includes causing the chamber liner to move to an operation position that blocks the access port after the substrate has been inserted into the interior volume. The chamber liner forms a return path from a cathode assembly to ground in the operation position. The method further includes generating a plasma using the cathode assembly.

In an exemplary embodiment, a method includes causing a chamber liner of a processing chamber to move between a loading position and an operation position. When the chamber liner is in the loading position, an interior volume of the processing chamber is accessible by an access port. When the chamber liner is in the operation position, the chamber liner at least partially encloses the interior volume. The method further includes causing a substrate to be inserted through the access port into the interior volume responsive to the chamber liner being positioned in the loading position. The method further includes causing a plasma to be generated using a cathode assembly responsive to the chamber liner being positioned in the operation position.

In an exemplary embodiment, a method includes causing a substrate to be inserted into an interior volume of a processing chamber responsive to a liner of the processing chamber being in a loading position. The method further includes causing the liner to move to an operation position. The liner includes one or more inner notch structures configured to engage with the processing chamber responsive to the liner moving to the operation position. The method further includes causing a plasma to be generated to process the substrate.

BRIEF DESCRIPTION OF THE DRAWINGS

The present disclosure is illustrated by way of example, and not by way of limitation, in the figures of the accompanying drawings in which like references indicate similar elements, wherein.

DETAILED DESCRIPTION

Figure 1A:
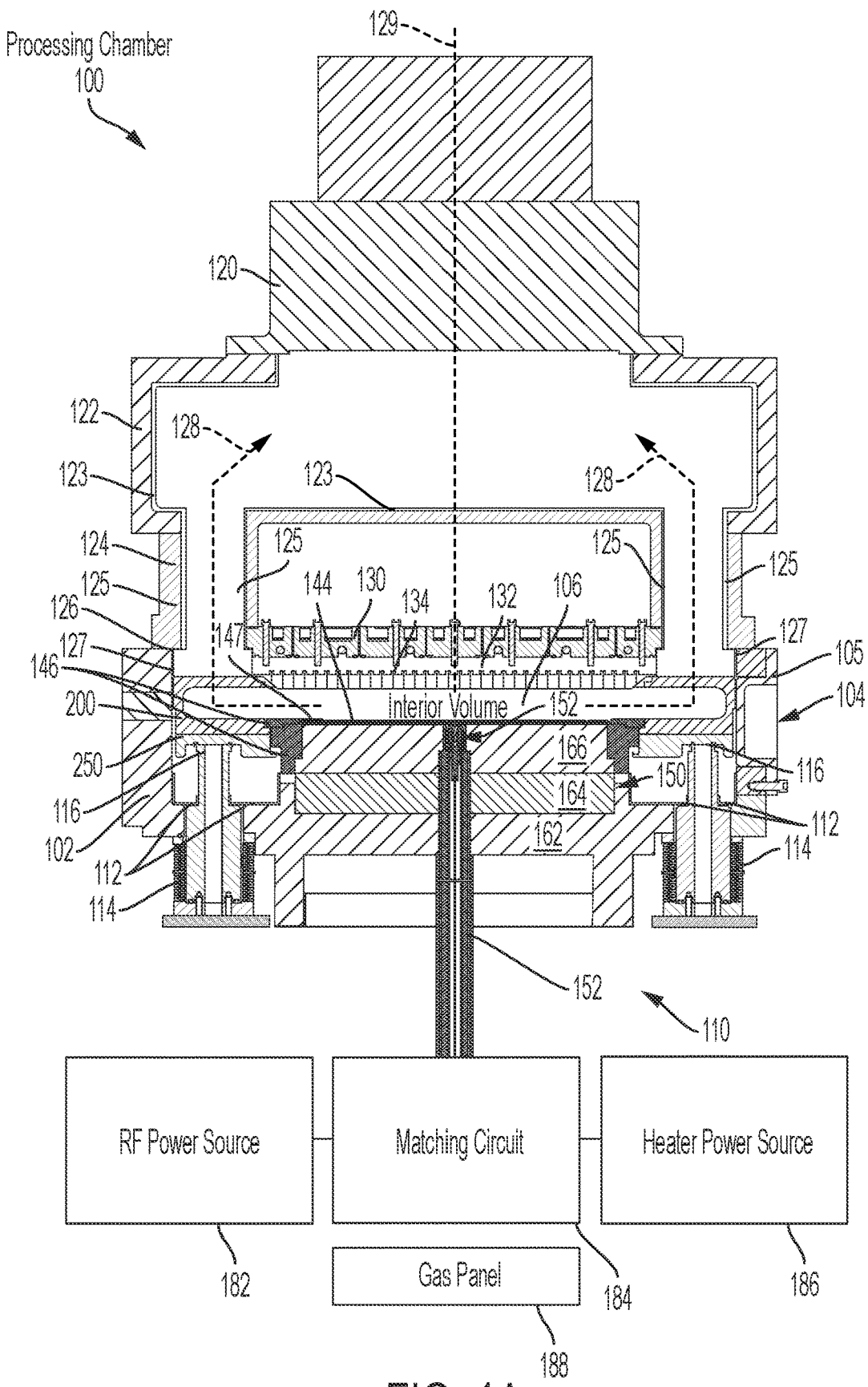
FIG. 1A depicts a sectional view of an illustrative processing chamber in accordance with an embodiment of the disclosure.

Embodiments described herein relate to chamber liners having continuous internal geometry, as well as to processing chambers (e.g., semiconductor processing chambers) incorporating the same, and methods of using the same. An exemplary chamber liner is configured for use in a semiconductor processing chamber to surround and partially encompass an internal volume in which a plasma is generated, and to provide a return path for a radio frequency (RF) cathode. The chamber liner has an interior cavity with a smooth, continuous plasma-facing surface that is radially-symmetric about a central axis. The processing chamber is designed to allow the chamber liner to be movable to different locations within the chamber. For example, the chamber liner may be moved to a loading position that allows a substrate (e.g., wafer) to be inserted into the processing chamber through an access port. Once the substrate is loaded, the chamber liner can then be moved to an operation position that blocks the access port.

In conventional processing chambers, liners that encompass the plasma during operation typically include a slot that can be opened to allow access to the interior volume of the processing chamber for substrate loading. Even when the liner is closed, the existence of the slot results in a discontinuous surface that introduces asymmetry in the RF return path, which leads to non-uniform etch rates during etch processes. In addition, conventional chamber designs typically utilize an RF power source, grounded electrode, and turbo pump that are all disposed below the chamber body. This design has several disadvantages, including constrained cathode packaging, larger chamber footprint, high voltage limitations due to indirect RF feed structures in the cathode, and higher material costs due to the larger chamber size.

The embodiments of the present disclosure overcome these limitations by providing a chamber liner with a continuous interior surface, thus providing a symmetric RF return path. In order to facilitate substrate loading, the processing chamber is adapted to move the chamber liner into a loading position that allows direct access from to the interior volume through the access port of the chamber body. Once the substrate is in place, the chamber liner can be moved into an operation position that covers and blocks the access port. Moreover, in some embodiments, the processing chamber is designed in a top-pump configuration with a turbo pump disposed above the chamber body, which allows for a more compact processing design that eases restrictions on the size of the cathode assembly.

The embodiments described herein provide several advantages over conventional processing chambers. In some embodiments, placing the pump system above the chamber body facilitates downward expansion of the cathode as desired, and allows for a straight and shorter direct RF feed that avoids arcs or corners in the cathode structure. In some embodiments, the processing chamber includes a top grounded electrode showerhead that allows for open space above the chamber body for use of a service hoist, thus improving the serviceability of the processing chamber. The chamber liner, which includes a continuous plasma-facing surface, avoids slots or other asymmetrical features, thus improving RF return and etch rate uniformity.

Figure 1B:
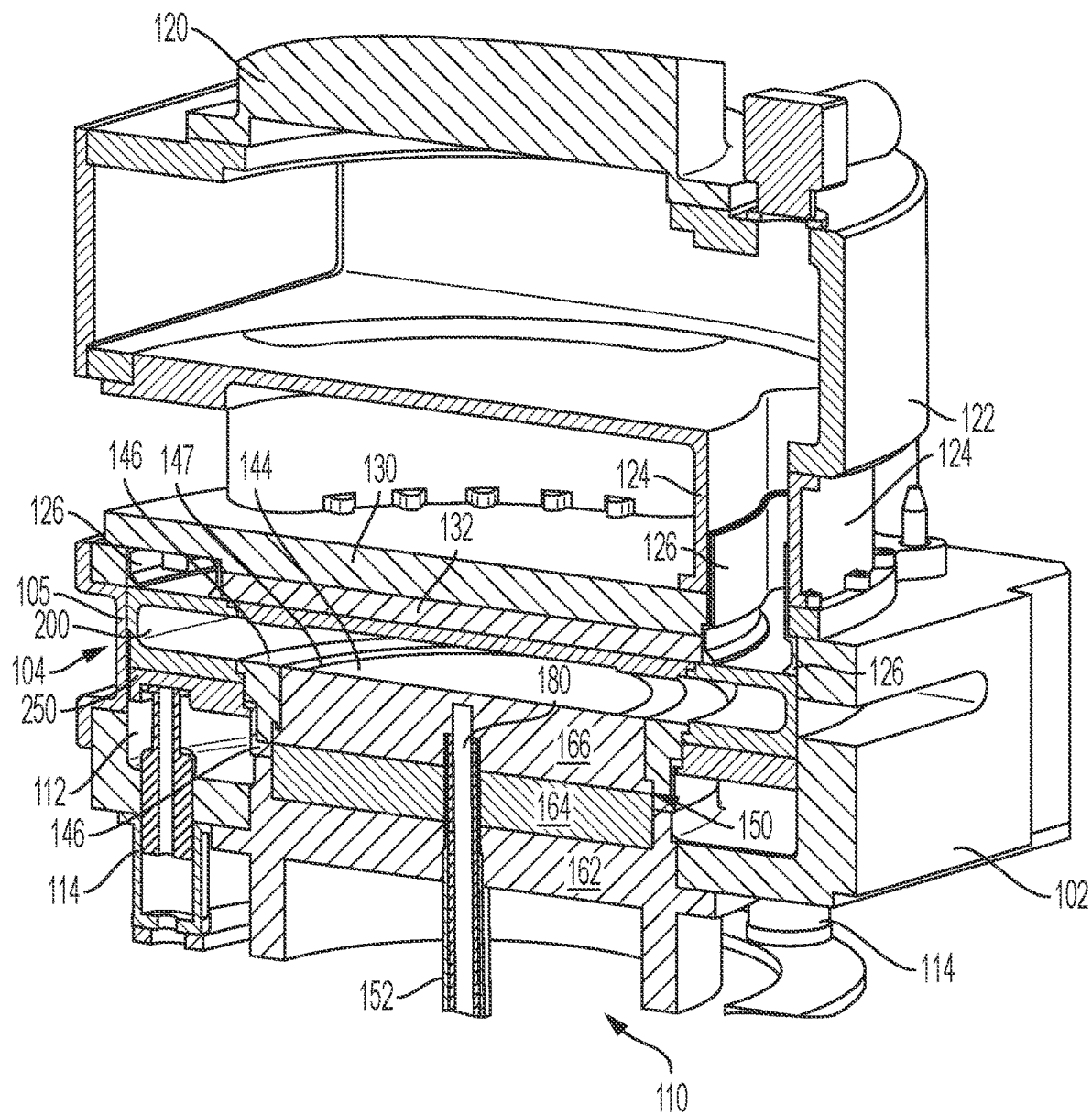
FIG. 1B depicts a cutaway orthographic view of the illustrative processing chamber of FIG. 1A.

FIG. 1A is a sectional view of a processing chamber 100 (e.g., a semiconductor processing chamber) according to an embodiment of the present disclosure, and FIG. 1B is a cutaway orthographic view of the processing chamber 100 to further illustrate its interior structure. The base materials of the processing chamber 100 and its various components may include one or more of aluminum (Al), titanium (Ti) and stainless steel. The processing chamber 100 may be used for processes in which a corrosive plasma environment is provided. For example, the processing chamber 100 may be a chamber for a plasma etcher or plasma etch reactor, a plasma cleaner, plasma enhanced chemical vapor deposition (CVD), atomic layer deposition (ALD) reactors, and so forth.

In one embodiment, the processing chamber 100 includes a chamber body 102, a cathode assembly 110, showerhead 130, and a chamber liner 200 that collectively enclose an interior volume 106. The chamber body 102 may be fabricated from aluminum, stainless steel or other suitable material, such as titanium. In some embodiments, the chamber body 102 may be formed at least partially from, or coated by, a thermal shock resistant and high erosion resistant ceramic material. The chamber body 102 includes an access port 104 for inserting a substrate 144 (e.g., a wafer) into the interior volume 106. Once the substrate 144 is inserted, a removable access cover 105 may be inserted to seal off the access port 104 from the external environment.

The processing chamber 100 further includes a pump system 120 that is fluidly coupled to the interior volume 106. Additional components include, for example, an RF power source 182 to provide power to the cathode assembly 110, a matching circuit 184 for maintaining a plasma formed from process and/or other gases within the interior volume 106 of the processing chamber 100, a heater power source 186 to provide temperature control of one or more components of the processing chamber 100, and a gas panel 188 that is fluidly coupled to the showerhead 130 to provide process and/or cleaning gases to the interior volume 106 through the showerhead 130 or other components (such as a lid or nozzle).

In one embodiment, the cathode assembly 110 includes a substrate support mount 162, a supporting a pedestal 152, and an electrostatic chuck (ESC) assembly 150. The substrate support mount 162 is disposed in the interior volume 106 of the processing chamber 100 below the showerhead 130. The substrate support mount 162 mechanically supports the ESC assembly 150 and the substrate 144 during processing, with the substrate support mount 162 being mechanically coupled to the chamber body 102. One or more outer rings 146 and an inner ring 147 may cover a portion of the ESC assembly 150, and may protect the covered portion from exposure to plasma during processing. The outer ring(s) 146 may be silicon or quartz in one embodiment. The inner ring 147 may be silicon in one embodiment.

In one embodiment, the ESC assembly 150 includes a thermally conductive base 164 and an electrostatic puck 166 bonded to the thermally conductive base by a bond, which may be a silicone bond in one embodiment. In one embodiment, an upper surface of the electrostatic puck 166 is covered by a ceramic coating layer, for example, on an upper surface of the electrostatic puck 166. In another embodiment, the ceramic coating layer is disposed on all surfaces of the ESC assembly 150 that are exposed to the interior volume 106 including the outer and side peripheries of the thermally conductive base 164 and the electrostatic puck 166. The substrate support mount 162 is coupled to a lower portion of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements to control a lateral temperature profile of the ESC assembly 150. The conduits may be fluidly coupled, for example, to an external fluid source that circulates a temperature regulating fluid through the conduits. The heating elements are regulated by a heater power source 186. The conduits and heating elements may be collectively utilized to control the temperature of the thermally conductive base 164, thus heating and/or cooling the electrostatic puck 166 and the substrate. The temperature of the electrostatic puck 166 and the thermally conductive base 164 may be monitored using a plurality of temperature sensors coupled to an external controller.

The electrostatic puck 166 may further include multiple gas passages such as grooves, mesas and other surface features, which may be formed in an upper surface of the electrostatic puck 166. The gas passages may be fluidly coupled to a source of a heat transfer (or backside) gas such as helium via holes drilled in the electrostatic puck 166. In operation, the backside gas (sourced from the gas panel 188 in some embodiments) may be provided at controlled pressure into the gas passages to enhance the heat transfer between the electrostatic puck 166 and the substrate 144. The electrostatic puck 166 includes at least one electrode 180 controlled by a radio-frequency (RF) power source 182. The electrode 180 (or other electrode disposed in the electrostatic puck 166 or the conductive base 164) may further be coupled to the RF power source 182 through the matching circuit 184. The RF power source 182 is generally capable of producing an RF signal having a frequency from about 50 kHz to about 3 GHz, with a power output of up to about 10,000 Watts.

The processing chamber 100 further includes a main pump port 122, slotted pump ports 124, and a plenum 126 that fluidly couple the interior volume 106 to the pump system 120 (which may be a turbo pump in some embodiments). Operation of the pump system creates flow paths 128 from the interior volume 106, through the plenum 126, the pump ports 124, and the main pump port 122 to the pump system 120. The chamber liner 200, as discussed below and illustrated in FIG. 2A, includes a plurality of openings 246 that define a portion of the flow paths 128 (not shown in FIG. 1A). In some embodiments, the pump ports 124 are arranged symmetrically about a vertical axis 129. Each component may have a corresponding liner disposed on their interior sidewalls: the main pump port 122 includes a main pump port liner 123, each pump port 124 includes a pump port liner 125, and the plenum 126 includes a plenum liner 127. Each liner may be fabricated from a material such as aluminum oxide, a ceramic material, or any other suitable material to protect their respective components. In some embodiments, one or more of the liners may be coated with an oxide material, such as a rare earth metal-containing ceramic material, that is resistant to erosion due to plasmas.

While the pump system 120 is illustrated in FIG. 1A as part of the processing chamber 100 in a top-pumping configuration, it is to be understood that the embodiments herein are not limited to this configuration. For example, the pump system 120 may be modified such that the pump is below the chamber body 102 or in any other suitable arrangement as would be appreciated by those of ordinary skill in the art.

In some embodiments, the showerhead 130 is used for dielectric etch processes (i.e., etching of dielectric materials). The showerhead 130 is supported above the chamber body 102, and may be formed from aluminum or anodized aluminum. The showerhead 130 includes a gas distribution plate (GDP) 132 having multiple gas delivery holes 134 throughout the GDP 132. The GDP 132 may be bonded to the showerhead 130, and may be formed from silicon or silicon carbide, or may be a ceramic such as $Y_2O_3$, $Al_2O_3$, yttrium aluminum garnet (YAG), and so forth. The gas panel 188 may be coupled to the processing chamber 100 to provide process and/or cleaning gases to the interior volume 106 through the showerhead 130. Alternatively, in some embodiments, the showerhead 130 may be replaced by a lid and a nozzle, or by multiple pie shaped showerhead compartments and plasma generation units in other embodiments.

For processing chambers used for conductor etches (i.e., etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound composed of $Y_4Al_2O_9$ and a solid-solution of $Y_2O_3$—$ZrO_2$. The nozzle may also be a ceramic, such as $Y_2O_3$, YAG, or the ceramic compound composed of $Y_4Al_2O_9$ and a solid-solution of $Y_2O_3$—$ZrO_2$. The lid, the GDP 132, and/or the nozzle may optionally be coated with a ceramic coating.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$ or $N_2O$. The ceramic materials described herein may be resistant to erosion from some or all of these gases and/or plasma generated from these gases. Examples of carrier gases include $N_2$, He, Ar, and other gases inert to process gases (e.g., non-reactive gases).

The processing chamber 100 may further include liners that cover and protect internal surfaces of the various components. In addition to the chamber liner 200, which will be described in greater detail with respect to FIG. 2, the processing chamber 100 further includes a main pump port liner 123, pump port liners 125, plenum liners 127, and lower liners 112. One or more of the liners may be formed from an oxide material, such as aluminum oxide, and may be coated with one or more coating layers, such as a plasma resistant rare earth metal-containing oxide.

Figure 3A:
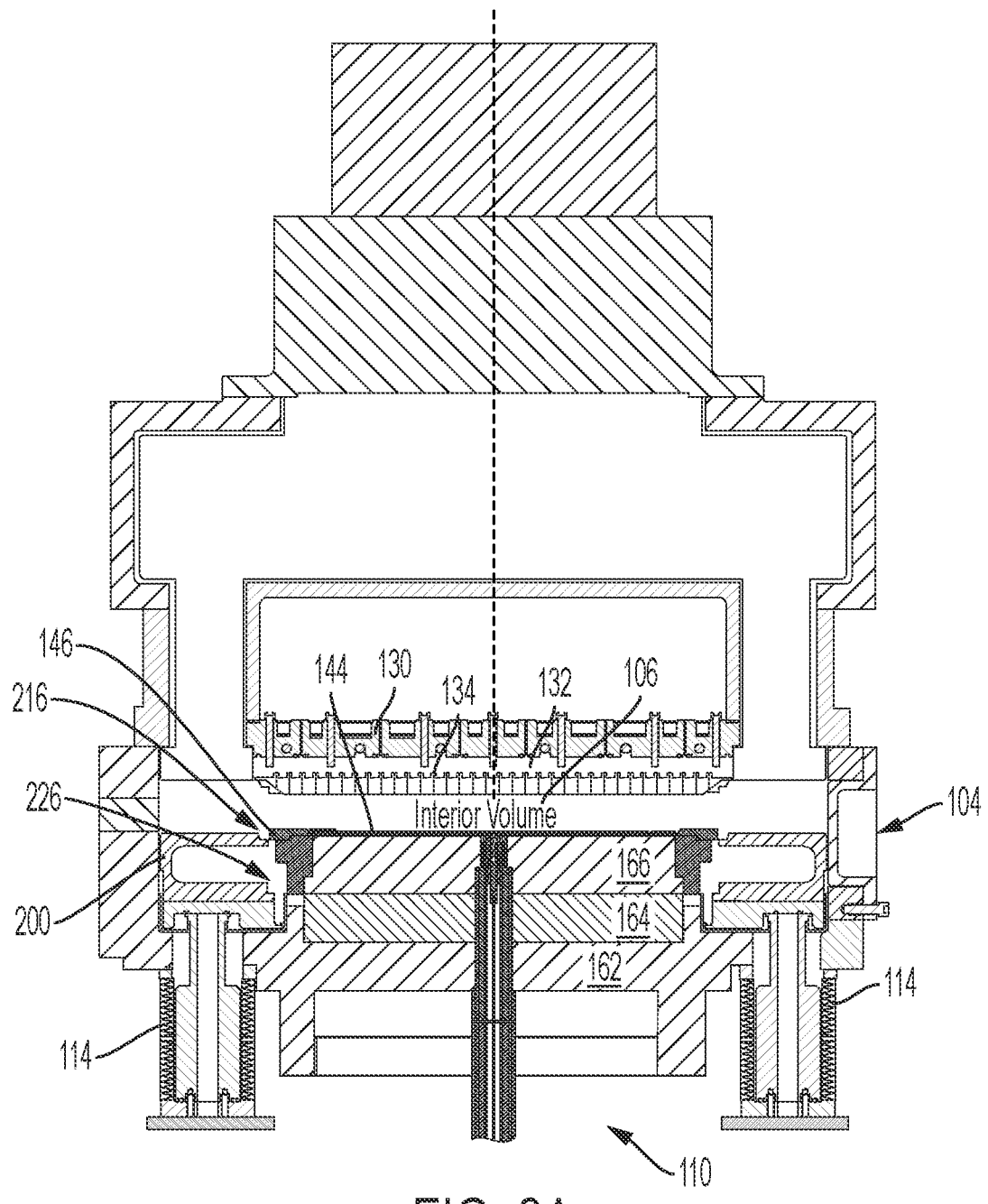
FIG. 3A depicts a chamber liner in a loading position within a processing chamber in accordance with embodiments of the disclosure.
Figure 3B:
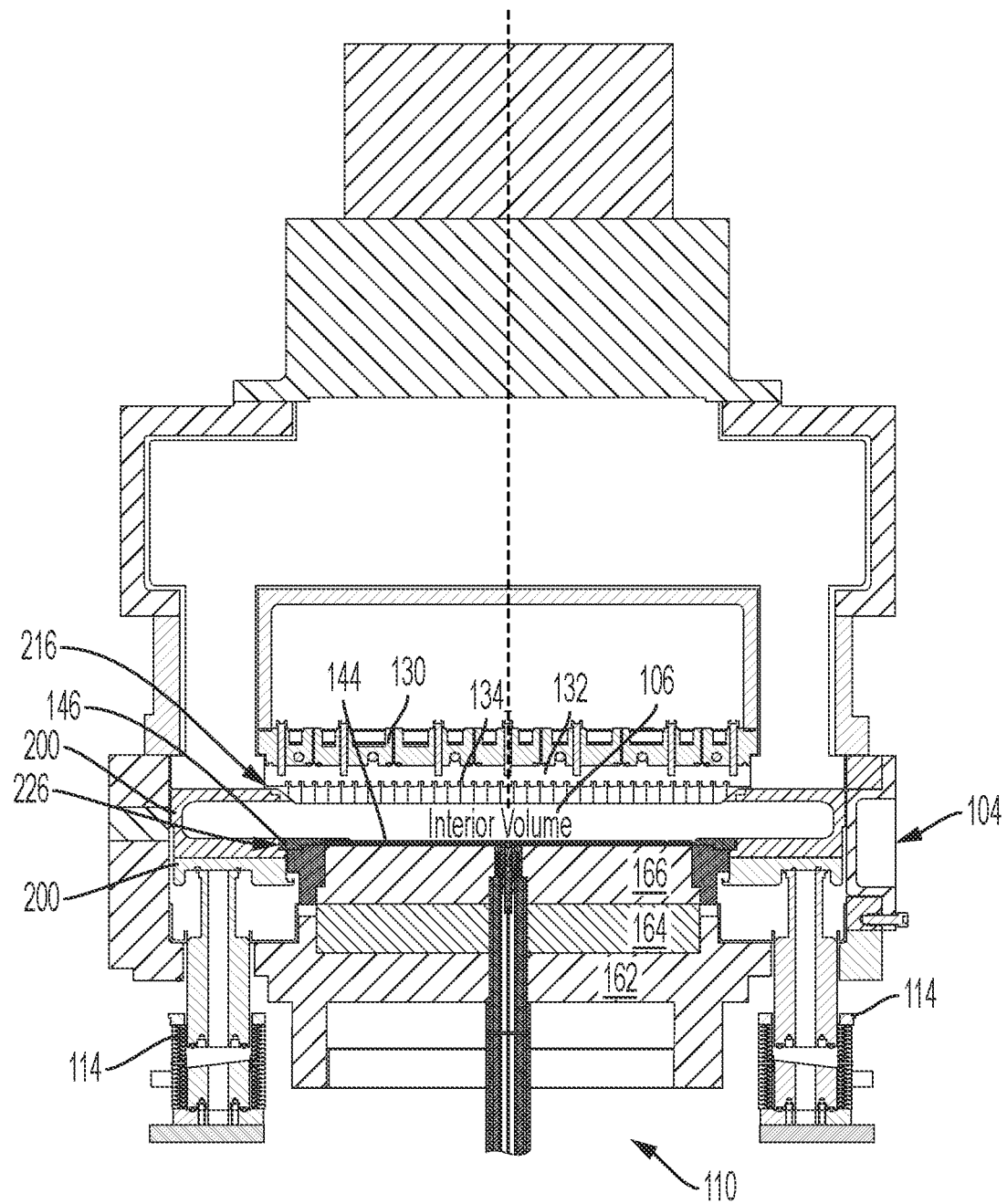
FIG. 3B depicts a chamber liner in an operation position within a processing chamber in accordance with embodiments of the disclosure.

The chamber liner 200 can be moved by actuator assemblies 114 within the processing chamber 100, and the movement of the chamber liner 200 is illustrated in and described with respect to FIGS. 3A-3B. The chamber liner 200 may be formed from polysilicon in an embodiment. In some embodiments, the chamber liner 200 may be formed from anodized aluminum and $Y_2O_3$-coated aluminum. In one embodiment, a lower surface of the chamber liner 200 is in contact with a thermally conductive heating element 250 and may be mechanically coupled to (e.g., via a mechanical fastener) or affixed to (e.g., via a chemical bond) the chamber liner 200. In some embodiments, the heating element 250 may be in a form of a ring that contacts at least a portion of the lower surface of the chamber liner 200. The heating element 250 may be further coupled to the one or more actuator assemblies 114. In some embodiments, the heating element 250 is omitted, with the one or more actuator assemblies 114 directly contacting and coupling to the chamber liner 200. In some embodiments, one or more thermocouples 116 may be routed through the actuator assemblies 114 to couple the heater power source 186 to the heating element 250. In some embodiments, the actuator assemblies 114 include outer bellows that provide a flexible seal around the internal components of the actuator assemblies 114.

In some embodiments, one or more components of the processing chamber 100 may be formed from or coated with a ceramic material that is resistant to erosion from plasmas. Examples of chamber components that may include a coating layer (e.g., a ceramic coating layer) include the substrate support mount 162, the ESC assembly 150, one or more of the rings 146 and 147, one or more walls of the chamber body 102, the showerhead 130, the GDP 132, one or more of the liners, as well as other components, such as a liner kit, a shield, a plasma screen, a flow equalizer, a cooling base, a chamber viewport, a chamber lid, and so on. Coatings may be deposited on the components using various techniques, such as ALD, sputtering, ion assisted deposition, plasma spray coating, CVD, or other suitable techniques as would be appreciated by one of ordinary skill in the art. In one embodiment, one or more of the coatings is a rare earth metal-containing coating including one or more of yttrium, erbium, lanthanum, lutetium, scandium, gadolinium, samarium, and/or dysprosium. For example, the rare earth metal-containing coating may include yttria ($Y_2O_3$), yttrium fluoride ($YF_3$), yttrium oxyfluoride ($Y_xO_yF_z$), yttrium zirconium oxide (YZrO), erbium oxide ($Er_2O_3$), erbium fluoride ($ErF_3$), erbium oxyfluoride ($Er_xO_yF_z$), erbium aluminum oxide ($Er_3Al_5O_{12}$), dysprosium oxide ($Dy_2O_3$), dysprosium fluoride ($DyF_3$), dysprosium oxyfluoride ($Dy_xO_yF_z$), gadolinium oxide ($Gd_2O_3$), gadolinium fluoride ($GdF_3$), gadolinium oxyfluoride ($Gd_xO_yF_z$), scandium oxide ($Sc_2O_3$), scandium fluoride ($ScF_3$), scandium oxyfluoride (ScOF), and so on. In some embodiments, the coating is polycrystalline $Y_2O_3$, $YF_3$, or $Y_xO_yF_z$. In other embodiments, the coating is amorphous $Y_2O_3$, $YF_3$, or $Y_xO_yF_z$. In one embodiment, the rare earth metal-containing coating may be co-deposited with another coating material. For example, a rare earth metal-containing oxide may be mixed with one or more other rare earth compounds such as $Y_2O_3$, gadolinium oxide ($Gd_2O_3$) and/or erbium (e.g., $Er_2O_3$). A yttrium-containing oxide for the coating may be, for example, $Y_xDy_yO_z$, $YXGd_yO_z$, or $Y_xEr_yO_z$. The yttrium-containing oxide may be $Y_2O_3$ having a cubic structure with space group Ia-3 (206). The subscripts x, y, and z, may independently range, for example, from 0.1 to 10.

The resistance of the coating and/or bulk oxide ceramic materials to plasma may be measured through "etch rate" (ER), which may have units of micrometer/hour (μm/hr) or Angstrom/hour (Å/hr), throughout the duration of the components' operation and exposure to plasma. Measurements may be taken after different processing times. For example, measurements may be taken before processing, or at about 50 processing hours, or at about 150 processing hours, or at about 200 processing hours, and so on. Variations in the composition of the coating grown or deposited on the heater support and/or other components may result in multiple different plasma resistances or erosion rate values. Additionally, a coating or bulk ceramic with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

Figure 2A:
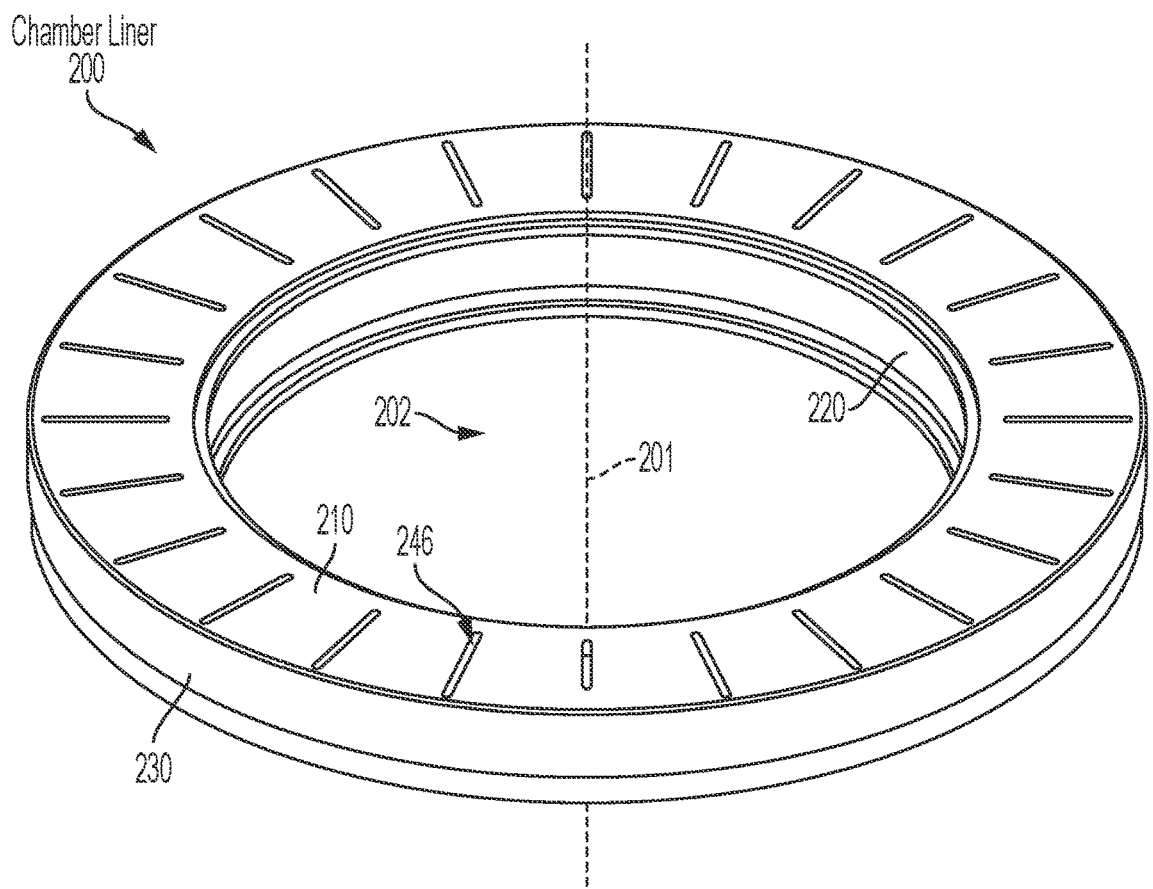
FIG. 2A depicts an orthographic view of an exemplary chamber liner in accordance with embodiments of the disclosure.
Figure 2B:
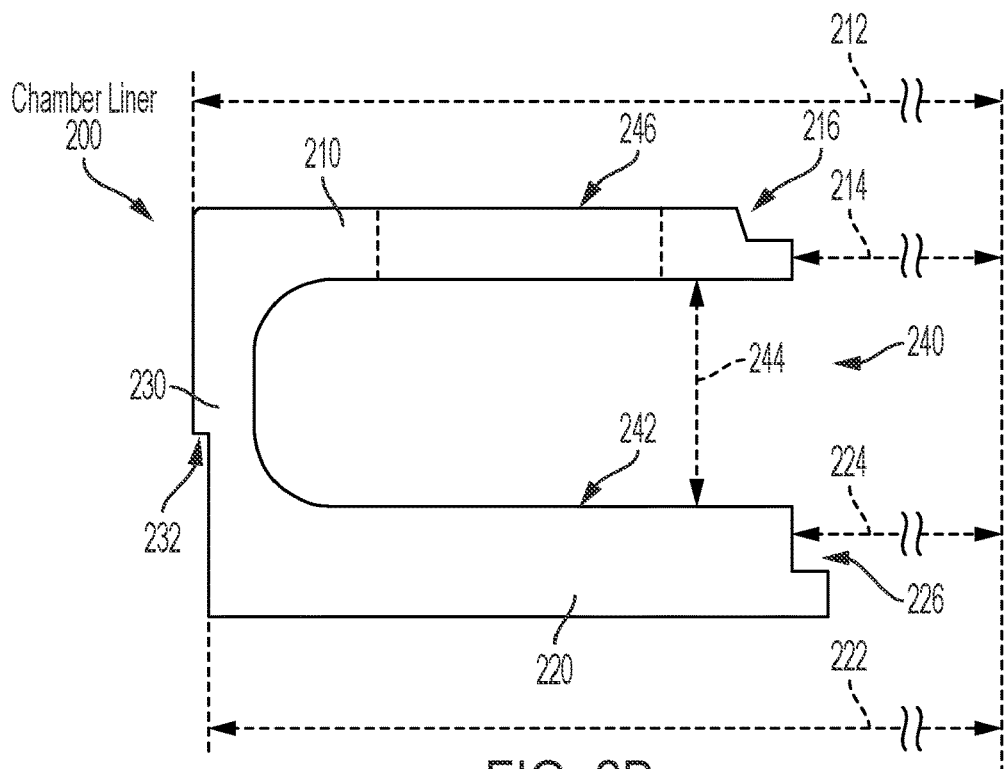
FIG. 2B depicts a sectional view of the exemplary chamber liner.

FIGS. 2A and 2B depict, respectively, an orthographic view and a sectional view of the chamber liner 200 in accordance with embodiments of the disclosure. The chamber liner 200 is a ring-shaped structure formed by an upper ring 210 and a lower ring 220, which are radially symmetric and concentric about a central axis 201. When the chamber liner 200 is installed within the processing chamber 100, the central axis 201 coincides with the vertical axis 129. The upper ring 210 includes a plurality of openings 246, which, when the chamber liner 200 is installed within the processing chamber 100, define a portion of the flow path 128 to allow air or gas to be evacuated from the interior volume 106. In some embodiments, the plurality of openings 246 comprise slots, holes, a mesh structure, or any other suitable structure provided that radial symmetry about the central axis 201 is maintained.

The upper ring 210 has an outer radius 212 and an inner radius 214 (which is measured with respect to a lower portion of the upper ring 210. Likewise, the lower ring 220 has an outer radius 222 and an inner radius 224 (which is measured with respect to an upper portion of the lower ring 220). The upper ring 210 and the lower ring 220 define a central cavity 202 that spans the inner radius 214 and the inner radius 224, within which a plasma is formed during operation of the processing chamber 100. In some embodiments, the central cavity 202 may encompass a portion of a cathode assembly, as will be illustrated in and discussed with respect to FIGS. 4A-4B. In some embodiments, the outer radius 212 and the outer radius 222 are equal. In some embodiments, the inner radius 214 and the inner radius 224 are equal.

The upper ring 210 is joined to the lower ring 220 via a vertical wall 230 at their respective outer radii 212 and 222. In some embodiments, the upper ring 210, the lower ring 220, and the vertical wall 230 form a unitary body, which may be formed from polysilicon or another suitable material. Together, the upper ring 210, the lower ring 220, and the vertical wall 230 define an interior cavity 240, which may have a height 244 of from 30 millimeters to 90 millimeters or greater. The interior cavity 240 includes a smooth interior surface 242, which is smooth, continuous, and radially symmetric about the central axis 201 along at least an upper surface of the lower planar ring. In some embodiments, the entire interior surface 242 is smooth, continuous, and radially symmetric about the central axis 201, with the exception of the plurality of openings 246 formed in the upper ring 210.

In some embodiments, the chamber liner 200 includes a plurality of notch structures, which facilitate physical engagement with surfaces of the various components within the processing chamber 100. For example, the upper ring 210 includes a notch 216 to engage with the GDP 132, the lower ring 220 includes a notch 226 to engage with the outer rings 146, and the vertical wall 230 includes a notch 232 which may engage with the chamber body 102.

FIGS. 3A and 3B depict the chamber liner 200 in a loading position and an operation position, respectively, within the processing chamber 100. In the loading position, shown in FIG. 3A, the actuator assemblies 114 retract to pull the chamber liner 200 so that an upper portion of the chamber liner 200 is flush with or below an upper portion of the electrostatic puck 166. This provides a direct path to insert the substrate 144 through the access port 104 into the interior volume 106. In the operation position, shown in FIG. 3B, the actuator assemblies 114 are extended to push the chamber liner 200 such that the notch 216 abuts with the GDP 132 and the notch 226 abuts the outer ring. In this position, the chamber liner 200 provides an RF return path from the cathode assembly 110 to ground.

Figure 4A:
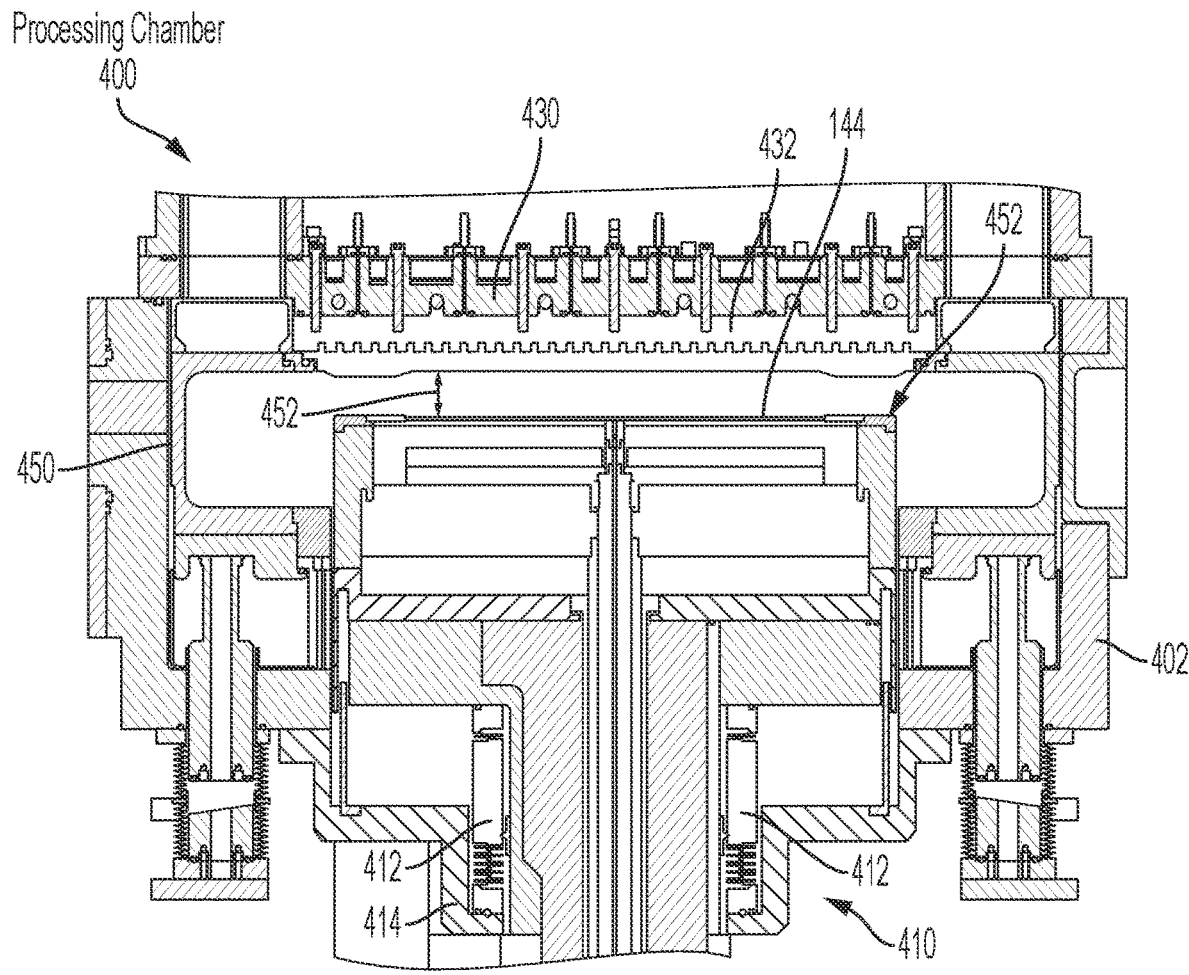
FIG. 4A depicts an operation position of the cathode assembly that results in a 30 mm gap between a substrate and a showerhead in accordance with an embodiment of the disclosure.
Figure 4B:
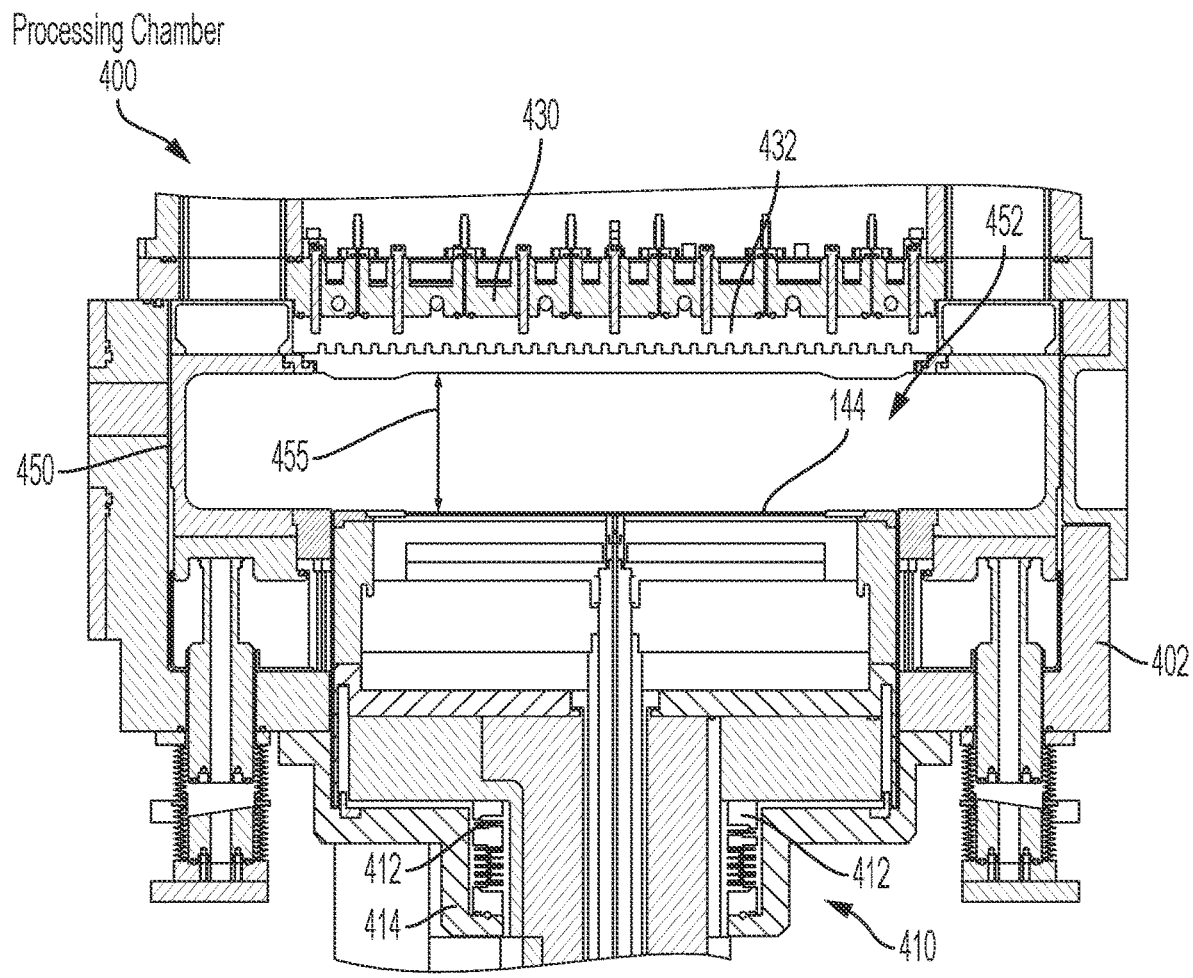
FIG. 4B depicts an operation position of the cathode assembly that results in a 90 mm gap between a substrate and a showerhead in accordance with an embodiment of the disclosure.

FIGS. 4A and 4B illustrate a processing chamber 400 that is configured to adjust a gap between a cathode assembly 410 and a GDP 432 of a showerhead 430. The processing chamber 400 may be the same as or similar to the processing chamber 100, and contains a chamber liner 450. The chamber liner 450, the chamber body 402, the showerhead 430, and the GDP 432 may be the same as or similar to their identically named counterparts described herein. The cathode assembly 410 may be similar to the cathode assembly 110, but is modified to include actuator assemblies 412 which may be used to adjust the vertical position of the cathode assembly 410 with respect to the showerhead 430 and the GDP 432. The cathode assembly 410 further includes an outer cover 414 which is mounted to the chamber body 402 and to the actuator assemblies 412.

FIG. 4A shows a small gap 454, which may be an approximately 30 millimeter gap between the substrate 144 and the GDP 432. When in this position, the substrate 144 and an upper portion of the cathode assembly pass through an inner cavity 452 defined through the chamber liner 450. FIG. 4B shows a large gap 455, which may be an approximately 90 millimeter gap between the substrate 144 and the GDP 432. In some embodiments, the movement of the cathode assembly 410 is performed manually, or may be automated, for example, by an external controller.

It is to be understand that the components depicted in FIGS. 1-4 are not necessarily drawn to scale, and are merely to illustrate the locations, orientations, and connectivity of the various components, as would be appreciated by one of ordinary skill in the art.

Figure 5:
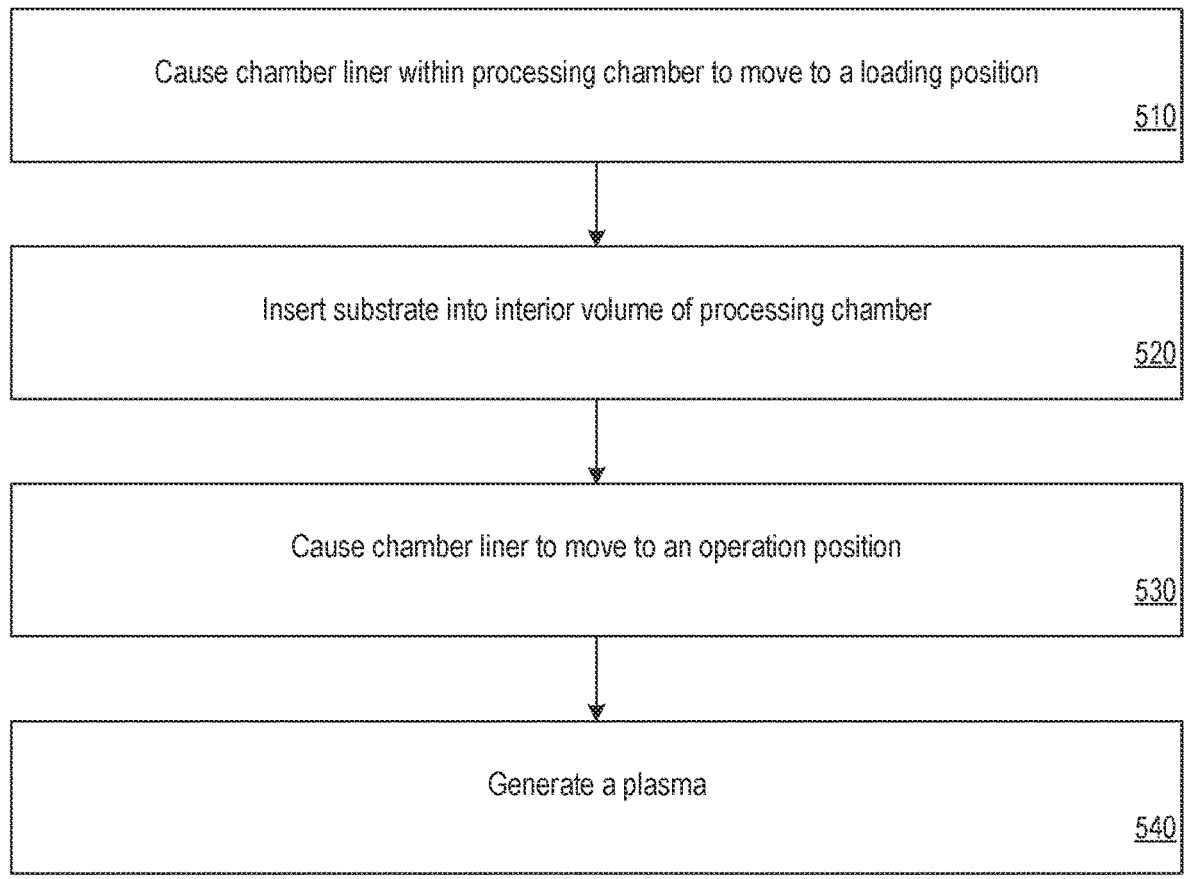
FIG. 5 illustrates a method of operating a processing chamber that includes a chamber liner in accordance with embodiments of the disclosure.

FIG. 5 illustrates a method 500 of operating a processing chamber that includes a chamber liner in accordance with embodiments of the disclosure. The method 500 may be performed using the processing chamber 100 and components thereof of any of FIGS. 1-3, or variations of the processing chamber 100. In some embodiments, each of the blocks of the method 500 may be performed automatically as part of an automated process that may be regulated by a controller or other device, and may utilize other components not shown in FIGS. 1-3, such as loading tray for loading a substrate into the processing chamber 100.

At block 510, the controller causes the chamber liner (e.g., the chamber liner 200) to move to or remain in a loading position within the processing chamber (e.g., the processing chamber 100). For example, the loading position may correspond to the position of the chamber liner 200 illustrated in and described with respect to FIG. 3A. In some embodiments, the chamber liner is coupled to one or more actuator assemblies (e.g., the actuator assemblies 114) that are configured to move the chamber liner along a vertical axis of the processing chamber (e.g., the vertical axis 129) into the loading position, and maintain the chamber liner in the loading position while a substrate (e.g., the substrate 144) is loaded into an interior volume of the processing chamber (e.g., the interior volume 106) through an access port (e.g., the access port 104). In some embodiments, the chamber liner may be moved manually using the actuator assemblies.

At block 520, the substrate is inserted into the interior volume of the processing chamber (e.g., above the ESC assembly 150 and within the inner ring 147). The substrate may be inserted manually, or the insertion may be automated, for example, using a loading tray that is operated by the controller.

At block 530, the controller causes the chamber liner to move to an operation position after the substrate has been inserted into the interior volume. For example, the operation position may correspond to the position of the chamber liner 200 illustrated in and described with respect to FIG. 3B. When the chamber liner is in the operation position, the chamber liner blocks the access port and forms an RF return path from the cathode assembly of the processing chamber (e.g., the cathode assembly 110) to ground. In some embodiments, the interior volume is enclosed by the chamber liner, a substrate support, and a showerhead (e.g., the showerhead 130) disposed above the substrate support when the chamber liner is in the operation position.

At block 540, the controller cause a plasma to be generated within the interior volume using the cathode assembly. The controller may further cause the chamber liner to be heated before, during, or after the plasma is generated by a heating element coupled to the chamber liner (e.g., the heating element 250).

The controller may further activate a pump system (e.g., the pump system 120), such as a turbo pump, to evacuate air or gas within the interior volume through a pump port (e.g., one or more of the pump ports 124) disposed above the chamber liner. The pump system may operate during a chamber process and during plasma generation to maintain vacuum conditions within the interior volume. An upper portion of the chamber liner may include a plurality of openings (e.g., openings 246) that define part of a flow path between the pump system and the interior volume.

In some embodiments, the cathode assembly may be configured to move through a central cavity of the chamber liner (e.g., the central cavity 202) to adjust a gap between the cathode assembly and the showerhead, as illustrated in and described with respect to FIGS. 1C and 1D.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the embodiments of the present disclosure. Thus, the specific details set forth are merely exemplary. Particular embodiments may vary from these exemplary details and still be contemplated to be within the scope of the present disclosure. These aforementioned embodiments are not intended to be limiting, and other embodiments not expressly disclosed are complemented, which may be one of several combinations or permutations of the various embodiments described herein.

It should be noted that different references to "an" or "one" embodiment in this disclosure are not necessarily to the same embodiment, and such references mean at least one. Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method of operating a processing chamber, the method comprising: causing a chamber liner within the processing chamber to move to a loading position to allow a substrate to be inserted through an access port of the processing chamber into an interior volume of the processing chamber; wherein the chamber liner comprises one or more inner notch structures configured to engage with one or more components of the processing chamber causing the chamber liner to move to an operation position that blocks the access port after the substrate has been inserted into the interior volume, wherein the chamber liner forms a return path from a cathode assembly to ground in the operation position; and generating a plasma using the cathode assembly.

2. The method of claim 1, further comprising:
heating the chamber liner while the plasma is generated by a heating element coupled to the chamber liner.

3. The method of claim 1, further comprising:
activating a pump system to evacuate air or gas within the interior volume to flow through a pump port disposed above the chamber liner.

4. The method of claim 3, wherein an upper portion of the chamber liner comprises a plurality of openings that define part of a flow path between the pump system and the interior volume.

5. The method of claim 1, wherein the interior volume is enclosed by the chamber liner, a substrate support mount, and a showerhead disposed above the substrate support mount.

6. The method of claim 5, further comprising:
moving the cathode assembly through a central cavity of the chamber liner to adjust a gap between the cathode assembly and the showerhead.

7. The method of claim 1, wherein the chamber liner comprises polysilicon.

8. The method of claim 1, wherein the chamber liner comprises a smooth interior surface that is radially symmetric about a vertical axis of the chamber liner.

9. The method of claim 1, wherein the processing chamber comprises a pump port disposed above the chamber liner that defines a flow path between a pump system and the interior volume.

10. The method of claim 1, wherein the chamber liner comprises:
a first ring having a first inner diameter and a first outer diameter;
a second ring having a second inner diameter and a second outer diameter, wherein the first ring and the second ring are spaced apart and arranged along a common central axis; and
a vertical wall coupling the first ring to the second ring at their respective first and second outer diameters.

11. The method of claim 10, wherein the first inner diameter and the second inner diameter are equal, and wherein a central cavity is defined between the first ring and the second ring.

12. The method of claim 10, wherein the first ring comprises a plurality of openings that are radially-symmetric about the common central axis.

13. A method comprising: causing a chamber liner of a processing chamber to move between a loading position and an operation position, wherein: when the chamber liner is in the loading position, an interior volume of the processing chamber is accessible by an access port, and when the chamber liner is in the operation position, the chamber liner at least partially blocks the access port; wherein the chamber liner comprises one or more inner notch structures that engage with the processing chamber responsive to the chamber liner moving to the operation position causing a substrate to be inserted through the access port into the interior volume responsive to the chamber liner being positioned in the loading position; and causing a plasma to be generated using a cathode assembly responsive to the chamber liner being positioned in the operation position.

14. The method of claim 13, wherein the chamber liner forms a return path from the cathode assembly to ground responsive to the chamber liner being positioned in the operation position.

15. The method of claim 13, wherein the chamber liner comprises a polysilicon body.

16. The method of claim 13, wherein the chamber liner comprises a smooth interior surface that is radially symmetric about a vertical axis of the chamber liner.

17. A method comprising:
causing a substrate to be inserted into an interior volume of a processing chamber responsive to a liner of the processing chamber moving to a loading position;
causing the liner to move to an operation position, wherein the liner comprises one or more inner notch structures that engage with the processing chamber responsive to the liner moving to the operation position; and
causing a plasma to be generated to process the substrate.

18. The method of claim 17, further comprising:
activating a pump system to evacuate air or gas within the interior volume to flow through a pump port disposed above the liner.

19. The method of claim 17, wherein the liner comprises a smooth interior surface that is radially symmetric about a vertical axis of the liner.

* * * * *